US012796523B2

(12) United States Patent
Chen

(10) Patent No.: US 12,796,523 B2
(45) **Date of Patent: *Nov. 10, 2026**

(54) METHODS OF MAKING A SHIELDED INTEGRATED CIRCUIT

(71) Applicant: Skyworks Solutions, Inc., Irvine, CA (US)

(72) Inventor: Lichuan Chen, Thousand Oaks, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 596 days.

This patent is subject to a terminal disclaimer.

(21) Appl. No.: 18/196,354

(22) Filed: May 11, 2023

(65) Prior Publication Data

US 2023/0369069 A1 Nov. 16, 2023

Related U.S. Application Data

(60) Provisional application No. 63/341,969, filed on May 13, 2022, provisional application No. 63/341,971, filed on May 13, 2022.

(51) Int. Cl.
*H01L 21/56* (2006.01)
*H05K 9/00* (2006.01)
(Continued)

(52) U.S. Cl.
CPC .......... *H10W 74/01* (2026.01); *H05K 9/0083* (2013.01); *H10W 42/20* (2026.01); *H10W 90/00* (2026.01)

(58) Field of Classification Search
CPC ... H01L 21/56; H01L 23/552; H01L 25/0655; H01L 25/50
See application file for complete search history.

(56) References Cited

U.S. PATENT DOCUMENTS 8,828,807 B1 * 9/2014 Wachter .................. B81B 7/007 257/E23.128
9,627,352 B2 4/2017 Read
(Continued)

OTHER PUBLICATIONS

Henkel Electronic Material, Component Level EMI Shielding for Semiconductor Packages, Presentation, Nov. 7, 2017, p. (1-40).
(Continued)

*Primary Examiner* — Thao P Le
(74) *Attorney, Agent, or Firm* — Knobbe, Martens, Olson & Bear, LLP

(57) ABSTRACT

Disclosed is a localized shield to protect integrated circuit (IC) components within a package module from electromagnetic interference (EMI). Conventional EMI shielding solutions, such as a compartment shield, protect an entire package but do not provide localized protection or grounding of IC components. To construct the EMI shield disclosed herein, a layer of conductive epoxy is deposited on an upper conductive surface of the IC component, then the component is encapsulated in mold compound. Excess mold compound is ground down to expose the epoxy layer, and a conformal shield layer is applied over the mold compound such that the conductive epoxy layer forms a ground path between the conformal shield and the conductive surface of the IC component.

20 Claims, 15 Drawing Sheets

(51) Int. Cl.

| | |
|---|---|
| ***H10W 42/20*** | (2026.01) |
| ***H10W 74/01*** | (2026.01) |
| ***H10W 90/00*** | (2026.01) |

(56) References Cited

U.S. PATENT DOCUMENTS

| | | | | |
|---|---|---|---|---|
| 10,200,077 | B2 | 2/2019 | Liu et al. | |
| 10,211,181 | B2 | 2/2019 | Read | |
| 10,593,565 | B2 | 3/2020 | Darveaux | |
| 10,615,841 | B2 | 4/2020 | Liu et al. | |
| 11,069,978 | B2 | 7/2021 | Hoang et al. | |
| 11,139,252 | B2 * | 10/2021 | Fang | H10P 72/74 |
| 11,201,066 | B2 | 12/2021 | Darveaux et al. | |
| 11,233,014 | B2 | 1/2022 | Chen et al. | |
| 11,450,645 | B2 * | 9/2022 | Bhushan | H10W 72/012 |
| 11,490,550 | B2 | 11/2022 | Jung et al. | |
| 11,605,571 | B2 | 3/2023 | Teixeira De Queiros et al. | |
| 11,682,585 | B2 | 6/2023 | Liu et al. | |
| 11,942,442 | B2 * | 3/2024 | Hsu | H01Q 1/2283 |
| 2003/0184978 | A1 | 10/2003 | Lobianco et al. | |
| 2004/0113283 | A1 * | 6/2004 | Farnworth | B33Y 70/00 257/E29.022 |
| 2005/0011672 | A1 | 1/2005 | Alawani et al. | |
| 2007/0138614 | A1 | 6/2007 | Harrison et al. | |
| 2007/0241440 | A1 | 10/2007 | Hoang et al. | |
| 2007/0284762 | A1 | 12/2007 | Barber et al. | |
| 2008/0112151 | A1 | 5/2008 | Thompson et al. | |
| 2008/0315396 | A1 | 12/2008 | Kuhlman et al. | |
| 2009/0155955 | A1 | 6/2009 | Liang et al. | |
| 2009/0221129 | A1 | 9/2009 | Barber et al. | |
| 2009/0249619 | A1 | 10/2009 | Thompson et al. | |
| 2009/0267220 | A1 | 10/2009 | Kuhlman et al. | |
| 2010/0073255 | A1 | 3/2010 | Noll et al. | |
| 2011/0084368 | A1 | 4/2011 | Hoang et al. | |
| 2012/0036710 | A1 | 2/2012 | Thompson et al. | |
| 2012/0080052 | A1 | 4/2012 | Canale et al. | |
| 2012/0137514 | A1 | 6/2012 | Hoang et al. | |
| 2012/0146178 | A1 | 6/2012 | Hoang et al. | |
| 2013/0021219 | A1 | 1/2013 | Agarwal et al. | |
| 2013/0324069 | A1 | 12/2013 | Chen et al. | |
| 2013/0335288 | A1 | 12/2013 | Read et al. | |
| 2014/0002188 | A1 | 1/2014 | Chen et al. | |
| 2014/0016277 | A1 | 1/2014 | Chen et al. | |
| 2014/0087633 | A1 | 3/2014 | Read et al. | |
| 2014/0119636 | A1 | 5/2014 | Nava et al. | |
| 2014/0119637 | A1 | 5/2014 | Nava et al. | |
| 2014/0167232 | A1 | 6/2014 | Lobianco et al. | |
| 2014/0175621 | A1 | 6/2014 | Chen et al. | |
| 2014/0175622 | A1 | 6/2014 | Chen et al. | |
| 2014/0307394 | A1 | 10/2014 | Lobianco et al. | |
| 2015/0070861 | A1 | 3/2015 | Thompson et al. | |
| 2015/0126134 | A1 | 5/2015 | Lobianco et al. | |
| 2015/0126139 | A1 | 5/2015 | Chen et al. | |
| 2015/0255402 | A1 | 9/2015 | Hoang et al. | |
| 2015/0255403 | A1 | 9/2015 | Hoang et al. | |
| 2015/0303977 | A1 | 10/2015 | Puente et al. | |
| 2015/0325548 | A1 | 11/2015 | Read et al. | |
| 2015/0326181 | A1 | 11/2015 | Chen et al. | |
| 2015/0326182 | A1 | 11/2015 | Chen et al. | |
| 2015/0326183 | A1 | 11/2015 | Chen et al. | |
| 2016/0014935 | A1 | 1/2016 | Agarwal et al. | |
| 2016/0035593 | A1 | 2/2016 | Read et al. | |
| 2016/0035679 | A1 | 2/2016 | Chen et al. | |
| 2016/0043456 | A1 | 2/2016 | Easter et al. | |
| 2016/0043813 | A1 | 2/2016 | Chen et al. | |
| 2016/0044842 | A1 | 2/2016 | Chen et al. | |
| 2016/0049374 | A1 | 2/2016 | Lobianco et al. | |
| 2016/0064337 | A1 | 3/2016 | Chen et al. | |
| 2016/0064351 | A1 | 3/2016 | Garing et al. | |
| 2016/0073490 | A1 | 3/2016 | Branchevsky et al. | |
| 2016/0095224 | A1 | 3/2016 | Chen et al. | |
| 2016/0099192 | A1 | 4/2016 | Chen et al. | |
| 2016/0126199 | A1 | 5/2016 | Roy et al. | |
| 2016/0162620 | A1 | 6/2016 | Chen et al. | |
| 2016/0163661 | A1 | 6/2016 | Chen et al. | |
| 2016/0181206 | A1 | 6/2016 | Read et al. | |
| 2016/0226552 | A1 | 8/2016 | Jin et al. | |
| 2016/0226553 | A1 | 8/2016 | Jin et al. | |
| 2016/0248469 | A1 | 8/2016 | Jin et al. | |
| 2017/0005693 | A1 | 1/2017 | Puente et al. | |
| 2017/0012603 | A1 | 1/2017 | Reisner et al. | |
| 2017/0025362 | A1 | 1/2017 | Nguyen et al. | |
| 2017/0042069 | A1 | 2/2017 | Lobianco et al. | |
| 2017/0117184 | A1 | 4/2017 | Liu et al. | |
| 2017/0125874 | A1 | 5/2017 | Whitefield et al. | |
| 2017/0149466 | A1 | 5/2017 | Lobianco et al. | |
| 2017/0221836 | A1 | 8/2017 | Nguyen et al. | |
| 2017/0236785 | A1 | 8/2017 | Chen et al. | |
| 2017/0301629 | A1 | 10/2017 | Read et al. | |
| 2017/0301630 | A1 | 10/2017 | Nguyen et al. | |
| 2017/0301653 | A1 | 10/2017 | Frenette et al. | |
| 2017/0301654 | A1 | 10/2017 | Frenette et al. | |
| 2017/0301655 | A1 | 10/2017 | Frenette et al. | |
| 2017/0301985 | A1 | 10/2017 | Nguyen et al. | |
| 2017/0301986 | A1 | 10/2017 | Nguyen et al. | |
| 2017/0302224 | A1 | 10/2017 | Frenette et al. | |
| 2017/0302325 | A1 | 10/2017 | Frenette et al. | |
| 2017/0303400 | A1 | 10/2017 | Frenette et al. | |
| 2017/0317710 | A1 | 11/2017 | Liu et al. | |
| 2017/0324395 | A1 | 11/2017 | Reisner et al. | |
| 2017/0337317 | A1 | 11/2017 | Chen et al. | |
| 2018/0006618 | A1 | 1/2018 | Monta et al. | |
| 2018/0076148 | A1 | 3/2018 | Nguyen et al. | |
| 2018/0096949 | A1 | 4/2018 | Chen et al. | |
| 2018/0096950 | A1 | 4/2018 | Chen et al. | |
| 2018/0096951 | A1 | 4/2018 | Chen et al. | |
| 2018/0198436 | A1 | 7/2018 | Joshi et al. | |
| 2018/0226361 | A1 | 8/2018 | Chen et al. | |
| 2018/0226367 | A1 | 8/2018 | Babcock et al. | |
| 2018/0233423 | A1 | 8/2018 | Lobianco et al. | |
| 2018/0240763 | A1 | 8/2018 | Chen et al. | |
| 2018/0242455 | A1 | 8/2018 | Kuhlman et al. | |
| 2018/0255643 | A1 | 9/2018 | Frenette et al. | |
| 2018/0261566 | A1 | 9/2018 | Babcock et al. | |
| 2018/0294558 | A1 | 10/2018 | Hoang et al. | |
| 2018/0294568 | A1 | 10/2018 | Hoang et al. | |
| 2018/0294569 | A1 | 10/2018 | Hoang et al. | |
| 2018/0315716 | A1 | 11/2018 | Chen et al. | |
| 2018/0315717 | A1 | 11/2018 | Nguyen et al. | |
| 2018/0322625 | A1 | 11/2018 | Nava et al. | |
| 2018/0324940 | A1 | 11/2018 | Choi et al. | |
| 2018/0365365 | A1 | 12/2018 | Chen et al. | |
| 2019/0043811 | A1 | 2/2019 | Chen et al. | |
| 2019/0043837 | A1 | 2/2019 | Frenette et al. | |
| 2019/0057929 | A1 | 2/2019 | Chen et al. | |
| 2019/0115309 | A1 | 4/2019 | Modi et al. | |
| 2019/0158043 | A1 | 5/2019 | Jin et al. | |
| 2019/0171785 | A1 | 6/2019 | Chen et al. | |
| 2019/0181906 | A1 | 6/2019 | Liu et al. | |
| 2019/0198451 | A1 | 6/2019 | Read et al. | |
| 2019/0198990 | A1 | 6/2019 | Nguyen et al. | |
| 2019/0214300 | A1 | 7/2019 | Liu et al. | |
| 2019/0230794 | A1 | 7/2019 | Frenette et al. | |
| 2019/0341687 | A1 | 11/2019 | Nguyen et al. | |
| 2019/0394912 | A1 | 12/2019 | Thompson et al. | |
| 2020/0035816 | A1 | 1/2020 | Cismaru et al. | |
| 2020/0044332 | A1 | 2/2020 | Lobianco et al. | |
| 2020/0058619 | A1 | 2/2020 | Frenette et al. | |
| 2020/0083861 | A1 | 3/2020 | Matsuo et al. | |
| 2020/0107433 | A1 | 4/2020 | Vijayakumar et al. | |
| 2020/0161222 | A1 | 5/2020 | Chen et al. | |
| 2020/0161254 | A1 | 5/2020 | Chen et al. | |
| 2020/0194382 | A1 | 6/2020 | Tsai et al. | |
| 2020/0212875 | A1 | 7/2020 | Goto et al. | |
| 2020/0212883 | A1 | 7/2020 | Goto et al. | |
| 2020/0227364 | A1 | 7/2020 | Chen et al. | |
| 2020/0229298 | A1 | 7/2020 | Lobianco et al. | |
| 2020/0258845 | A1 | 8/2020 | Nguyen et al. | |
| 2020/0279825 | A1 | 9/2020 | Babcock et al. | |
| 2020/0321287 | A1 | 10/2020 | Chen et al. | |
| 2020/0357756 | A1 | 11/2020 | Wallis et al. | |
| 2021/0045231 | A1 | 2/2021 | Branchevsky et al. | |
| 2021/0143542 | A1 | 5/2021 | Nguyen et al. | |
| 2021/0217714 | A1 | 7/2021 | Soliman et al. | |

(56) References Cited

U.S. PATENT DOCUMENTS

| | | | |
|---|---|---|---|
| 2021/0281246 | A1 | 9/2021 | Maki et al. |
| 2021/0320081 | A1 | 10/2021 | Babcock et al. |
| 2021/0336332 | A1 | 10/2021 | Lobianco et al. |
| 2021/0399423 | A1 | 12/2021 | Hoang et al. |
| 2022/0102296 | A1* | 3/2022 | Kitajima .............. H01Q 1/2283 |
| 2022/0115331 | A1 | 4/2022 | Chen et al. |
| 2022/0148984 | A1 | 5/2022 | Chen et al. |
| 2022/0254179 | A1 | 8/2022 | Nava et al. |
| 2022/0319968 | A1 | 10/2022 | Chen et al. |
| 2022/0338342 | A1 | 10/2022 | Branchevsky et al. |
| 2023/0025511 | A1 | 1/2023 | Wong et al. |
| 2023/0059917 | A1 | 2/2023 | Takano et al. |
| 2023/0115846 | A1 | 4/2023 | Nguyen et al. |
| 2023/0135057 | A1 | 5/2023 | Chen et al. |
| 2023/0139251 | A1 | 5/2023 | Chen et al. |
| 2023/0292438 | A1* | 9/2023 | Weng ..................... H05K 1/144 |
| 2023/0369069 | A1 | 11/2023 | Chen |
| 2023/0369239 | A1 | 11/2023 | Chen |

OTHER PUBLICATIONS

LPKF Laser & Electronics, Package Level EMI Shielding, dated Nov. 11, 2021, https://amp-technology.ipkf.com/en/applications/emi-shielding, pp. 1 and 2 of 5.

U.S. Appl. No. 18/196,361, filed May 11, 2023, EMI Shielding With Conductive Epoxy.

* cited by examiner

METHODS OF MAKING A SHIELDED INTEGRATED CIRCUIT

CROSS-REFERENCE TO RELATED APPLICATION(S)

This application claims the benefit of U.S. Provisional Application No. 63/341,969 and U.S. Provisional Application No. 63/341,971, both filed May 13, 2022. The foregoing applications are hereby incorporated by reference in their entireties. Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure generally relates to shielding electronic modules and relates in particular to shielded radiofrequency (RF) modules.

Description of the Related Art

In wireless communication applications, size, cost, and performance are examples of factors that can be important for a given product. For example, to increase performance, wireless components such as a diversity receive antenna and associated circuitry are becoming more popular.

In many radiofrequency (RF) applications, RF circuits and related devices can be implemented in a packaged module. The RF circuits and other devices can emit electromagnetic interference, which can affect the operation of the module.

SUMMARY OF THE INVENTION

According to certain aspects, a localized shield is provided to protect integrated circuit (IC) components within a package module from electromagnetic interference (EMI). Conventional EMI shielding solutions, such as a compartment shield, protect an entire package but may not provide sufficient localized protection or grounding of IC components. To construct the EMI shield according to certain aspects, a layer of conductive epoxy is deposited on an upper conductive surface of the IC component, then the component is encapsulated in mold compound. Excess mold compound is ground down to expose the epoxy layer, and a conformal shield layer is applied over the mold compound such that the conductive epoxy layer forms a ground path between the conformal shield and conductive surface of the IC component.

In one aspect, a method of constructing a shielded integrated circuit package includes mounting a semiconductor die to a printed circuit board, applying a conductive adhesive layer over a conductive top surface of the semiconductor die, applying an over-mold above the printed circuit board, encasing a periphery of the semiconductor die within the over-mold, removing an excess portion of the over-mold to expose at least a portion of the conductive adhesive layer, and applying a conformal metal shield over the over-mold, the conductive adhesive layer and the conformal metal shield forming a path from the semiconductor die to a ground reference.

In some cases, the semiconductor die includes one or more of a surface acoustic wave filter, bulk acoustic wave filter, power amplifier, or low-noise amplifier. The conformal metal shield can be of aluminum, copper, nickel, iron, tin, or zinc. The conformal metal shield can be configured to attenuate radio frequency signals in the n77, n78, or n79 New Radio frequency bands, and can attenuate radio frequency signals in one or more of the New Radio frequency bands by at least 5 dB.

Mounting the semiconductor die to the printed circuit board can further include forming an electrical and mechanical connection between a first plurality of contact pads and a corresponding second plurality of contact pads. A subset of the first plurality of contact pads and a corresponding subset of the second plurality of contact pads may be provided to form a mechanical connection between the semiconductor die and the printed circuit board. The semiconductor die can be mounted to the printed circuit board using surface-mount technology. The conformal metal shield may be applied by sputtering or spraying a metallic paint, or by shaping a portion of solid metal over the top surface of the package.

Applying the conformal metal shield can further includes forming a plurality of bond wires about a perimeter of the package. The conductive adhesive layer can be applied by dispensing or screen printing. Removing the excess portion of the over-mold can be performed by cutting or grinding, by laser ablation, or by a chemical treatment.

In another aspect, a method of constructing a radio frequency packaged module includes mounting a first and a second semiconductor die to a printed circuit board, each of the semiconductor dies having a conductive top surface, applying a first conductive adhesive layer over a corresponding conductive top surface of the first semiconductor die, applying a second conductive adhesive layer over a corresponding conductive top surface of the second semiconductor die, applying an over-mold above the printed circuit board, encasing a periphery of each of the first and second semiconductor dies while exposing at least a portion of each of the first and second conductive adhesive layers, and applying a conformal metal shield over the over-mold and over the conductive adhesive layers such that the first conductive adhesive layer and the conformal metal shield form a path from the first semiconductor die to a ground reference, and the second conductive adhesive layer and the conformal metal shield form a path from the second semiconductor die to the ground reference.

In some cases, at least one of the semiconductor dies can include a surface acoustic wave filter, bulk acoustic wave filter, power amplifier, or a low-noise amplifier. The radio frequency packaged module can be a front-end module. The conformal metal shield can be configured to attenuate radio frequency signals causing electromagnetic interference in the n77, n78, or n79 New Radio frequency bands by at least 5 dB.

In one aspect, a shielded integrated circuit package, includes a printed circuit board, a semiconductor die mounted to the printed circuit board and having a conductive top surface, a conductive adhesive layer provided on the conductive top surface, an over-mold above the printed circuit board, the over-mold encasing a periphery of the semiconductor die while exposing at least a portion of a top surface of the conductive adhesive layer, and a conformal metal shield over the over-mold and over the conductive adhesive layer, the conductive adhesive layer and the conformal metal shield forming a path from the semiconductor die to a ground reference.

In some cases, the semiconductor die can include a surface-mount device. The semiconductor die can further include one or more of a surface acoustic wave filter, bulk acoustic wave filter, power amplifier, or low-noise amplifier. The adhesive layer can include a conductive epoxy. The conformal metal shield can be of aluminum, copper, nickel, iron, tin, or zinc, and can be configured to attenuate radio frequency signals causing electromagnetic interference in the n77, n78, or n79 New Radio frequency bands. The shielded integrated circuit package may be configured as a ball grid array package. The package may further include a plurality of bond wires forming a wire cage around the package.

In another aspect, a radio frequency packaged module includes a printed circuit board, a first and a second semiconductor die mounted to the printed circuit board and each having a conductive top surface, a first conductive adhesive layer provided on a conductive top surface of the first semiconductor die and a second conductive adhesive layer provided on a conductive top surface of the second semiconductor die, an over-mold above the printed circuit board, the over-mold encasing a periphery of each of the semiconductor dies while exposing at least a portion of a top surface of both the first and second conductive adhesive layer, and a conformal metal shield over the over-mold and over the first and second conductive adhesive layers, the first conductive adhesive layer and the conformal metal shield forming a path from the first semiconductor die to a ground reference and the second conductive adhesive layer and the conformal metal shield forming a path from the second semiconductor die to the ground reference.

In some cases, each of the semiconductor dies include one or more of a surface acoustic wave filter, bulk acoustic wave filter, power amplifier, or a low-noise amplifier. The module can be a front-end module. The conformal metal shield can be configured to substantially attenuate radio frequency signals causing electromagnetic interference in the n77, n78, or n79 New Radio frequency bands. The radio frequency packaged module may be configured as a ball grid array package. The packaged module may further include a plurality of bond wires forming a wire cage around the module.

In yet another aspect, a mobile device can include a radio frequency packaged module according to the present disclosure. The mobile device further includes an antenna coupled to the radio frequency packaged module. In some cases, a plurality of bond wires extend between the printed circuit board and the conformal metal shield to form a wire cage around the radio frequency packaged module. The wire cage is configured to attenuate radio frequency noise emissions of the semiconductor die by coupling the noise emissions to the ground reference. The plurality of bond wires can be configured to form a perimeter boundary around the semiconductor die. The conductive adhesive layer can form an electrical connection between one or more of the bond wires and the ground reference. The conformal metal shield can be configured to attenuate radio frequency signals causing electromagnetic interference in the n77, n78, or n79 New Radio frequency bands.

Any of the features, components, or details of any of the arrangements or embodiments disclosed in this application, including without limitation any of the apparatus embodiments and any of the radio frequency embodiments disclosed herein, are interchangeably combinable with any other features, components, or details of any of the arrangements or embodiments disclosed herein to form new arrangements and embodiments.

DETAILED DESCRIPTION OF THE PREFERRED EMBODIMENT

Figure 1:
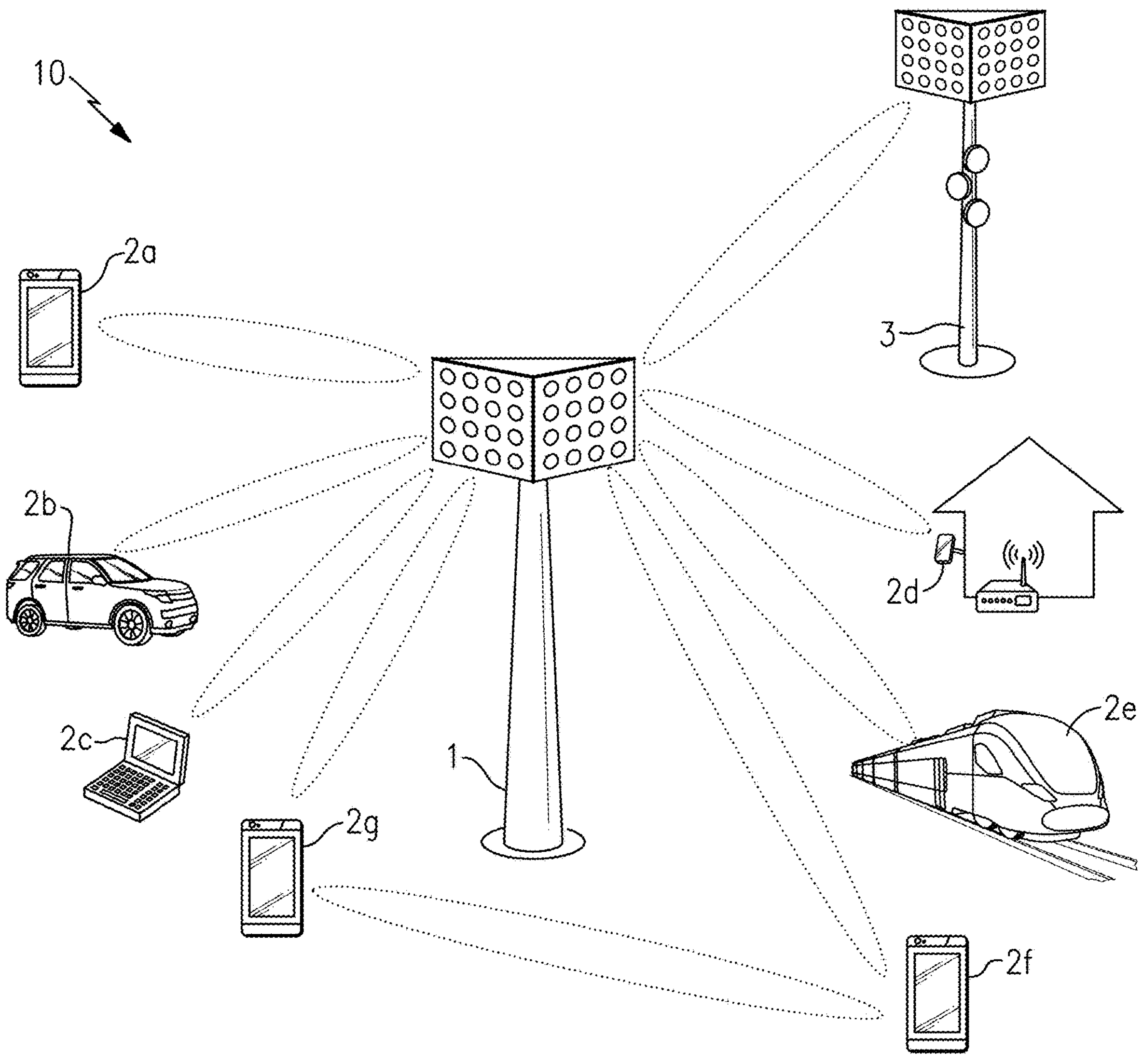
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Mobile Communications System

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, a second mobile device 2*f*, and a third mobile device 2*g*.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2*g* and mobile device 2*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1) in the range of about 410 MHz to about 7.125 GHz, Frequency Range 2 (FR2) in the range of about 24.250 GHz to about 52.600 GHz, or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2:
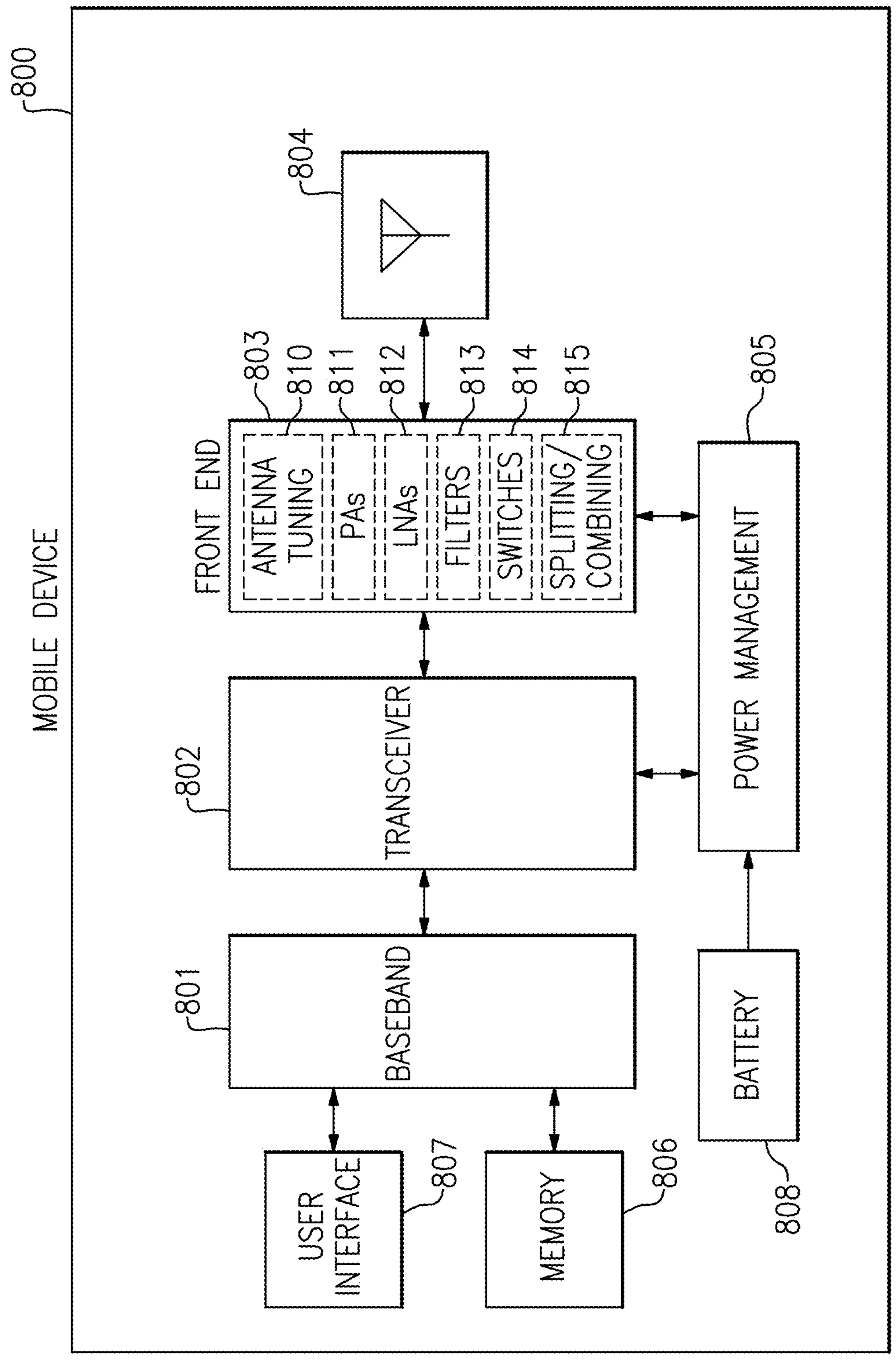
FIG. 2 is a schematic diagram of one embodiment of a mobile device.

FIG. 2 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 2 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 2, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 2, the power management system 805 receives a battery voltage from the battery 808. The battery 808 can be any suitable battery for use in the mobile device 800, including, for example, a lithium-ion battery.

Figure 3A:
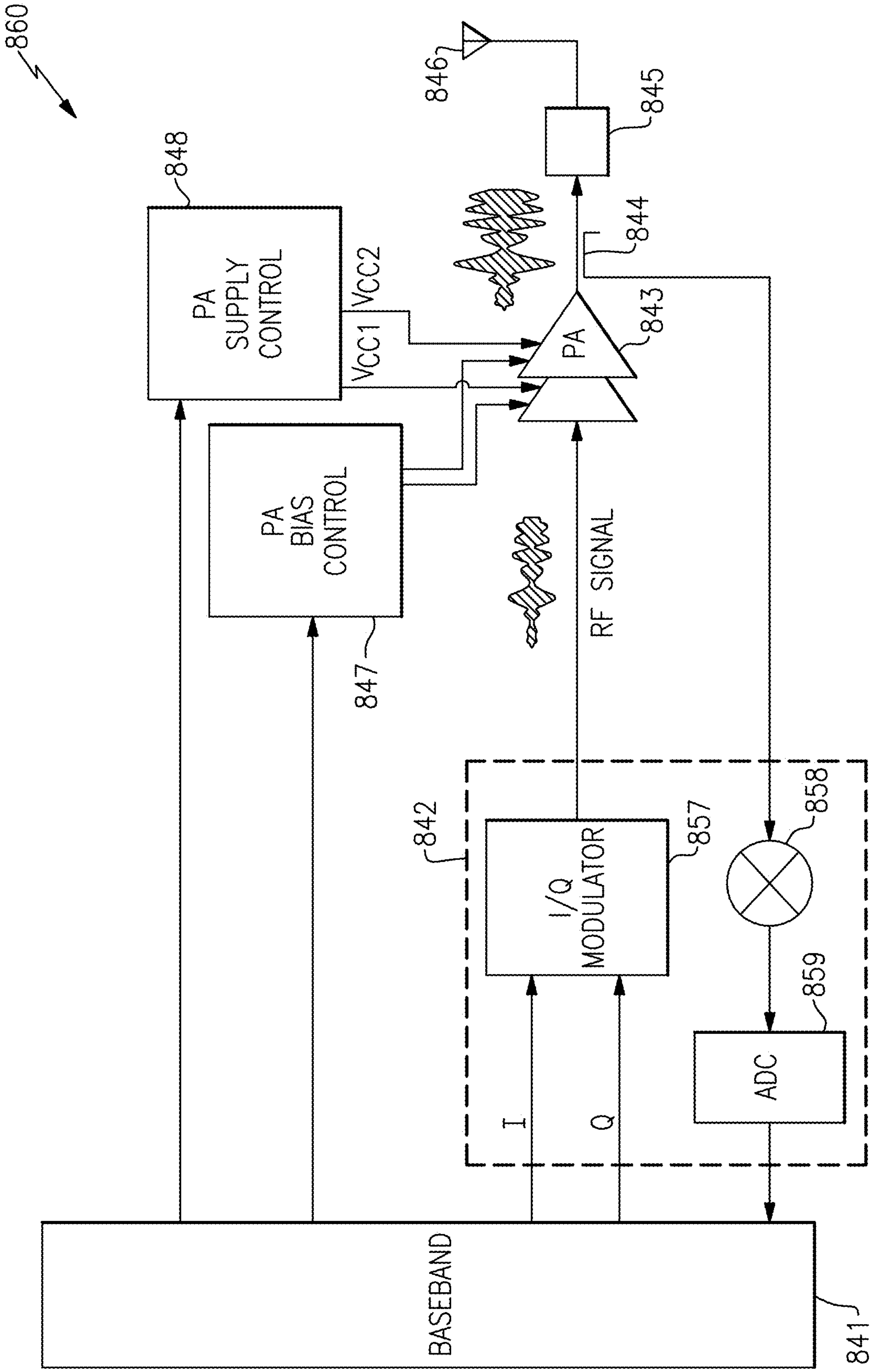
FIG. 3A is a schematic diagram of a power amplifier system according to one embodiment.

FIG. 3A is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog to digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in¬phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage VCC1 for powering an input stage of the power amplifier 843 and a second supply voltage VCC2 for powering an output stage of the power amplifier 843. The PA supply control circuit 848 can control the voltage level of the first supply voltage VCC1 and/or the second supply voltage VCC2 to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 3A, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 3B:
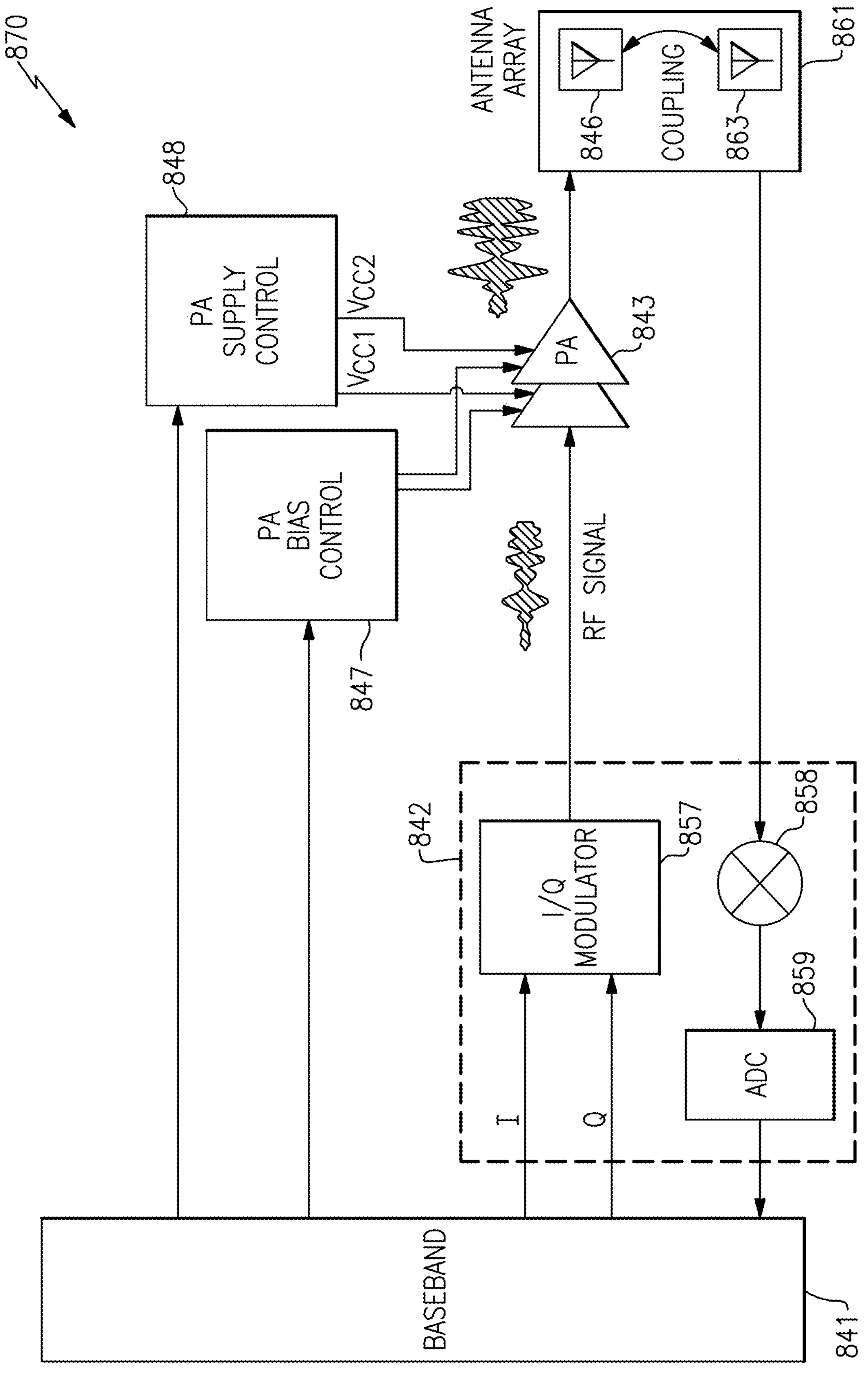
FIG. 3B is a schematic diagram of a power amplifier system according to another embodiment.

FIG. 3B is a schematic diagram of a power amplifier system 870 according to another embodiment. The illustrated power amplifier system 870 includes a baseband processor 841, a transmitter/observation receiver 842, a power amplifier 843, an antenna array 861, a PA bias control circuit 847, and a PA supply control circuit 848. As shown in FIG. 3B, the antenna array 861 includes an antenna 861 and an observation antenna 863.

The power amplifier system 870 of FIG. 3B is similar to the power amplifier system 860 of FIG. 3A, except that the power amplifier system 870 omits the directional coupler 844 and the front-end circuitry 845 of FIG. 3A to avoid loading loss at the output of the power amplifier 843. For example, the power amplifier system 870 can aid in providing low signal loss when transmitting at millimeter wave frequencies. As shown in FIG. 3B, the observation antenna 863 is coupled to the antenna 861 by antenna-to-antenna coupling, and serves to provide an observation signal for the observation path of the transmitter/observation receiver 842.

Packaged Module with Local EMI Shielding

Figure 4A:
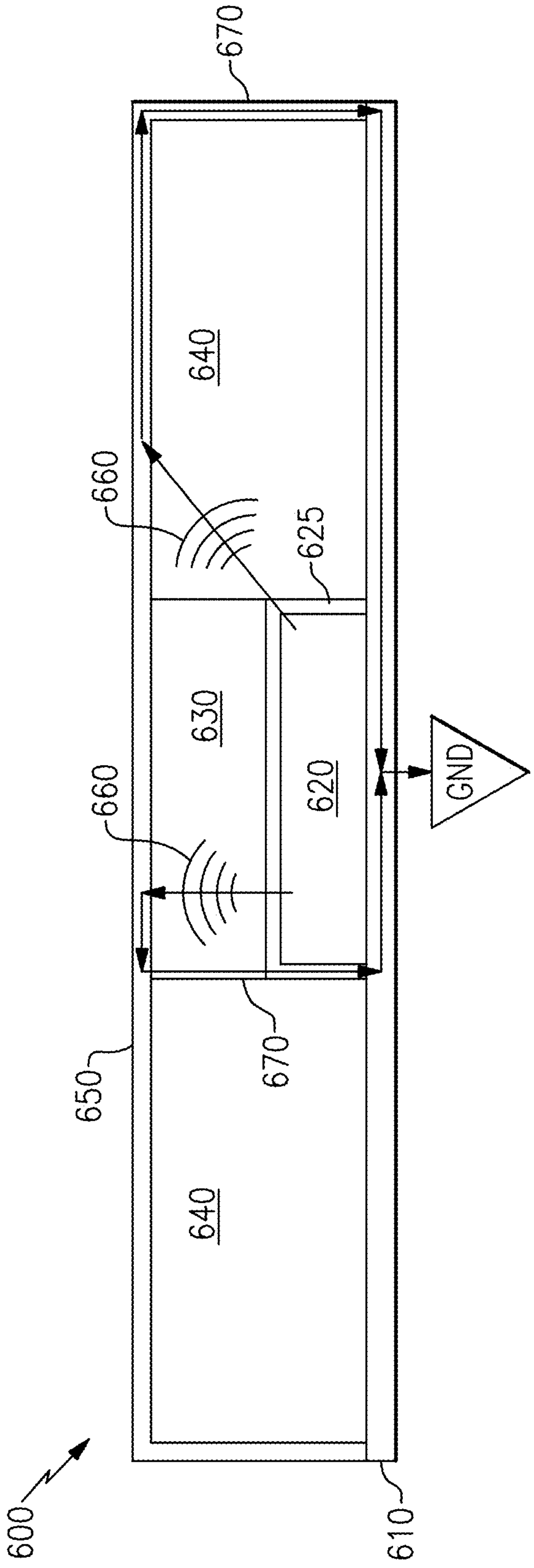
FIG. 4A is a schematic diagram of a cross-section of one embodiment of a packaged module illustrating EMI shielding for signal attenuation.

FIG. 4A is a schematic diagram of a cross section of a packaged module 600 with component-level shielding from electromagnetic interference (EMI). The packaged module 600 may be constructed according to any of the embodiments described herein and can implement any of the mobile device components of any of the previous Figures.

The packaged module 600 includes a printed circuit board (PCB) layer 610 forming a base or substrate of the module 600. The PCB layer 610 can have a substantially rectangular footprint upon which various additional layers of the module 600 are stacked. In the preferred embodiment, the additional layers of the module 600 are constrained within an outer perimeter of the PCB layer which defines the substantially rectangular footprint. As shown in FIG. 4A, the packaged module 600 has a quadrilateral profile formed by the base PCB layer 610 and the various additional layers stacked upon and above the PCB layer 610. In the preferred embodiment, the top plan-view and cross-sectional profiles of the packaged module 600 is substantially rectangular, although other form-factors are possible.

At least one semiconductor die 620 is electrically connected to the PCB layer 610, e.g., via soldered wirebonds extending from contact pins arranged around the periphery of the die 620 to corresponding contacts pads on the top of the PCB layer 610. In certain alternative embodiments, the semiconductor die 620 is a flip-chip die (e.g., the flip-chip die 952 of FIG. 6B). In such cases, the die 620 is connected to the PCB layer 610 via soldered die pads instead of peripheral wirebonds. However, the semiconductor die 620 can be connected to the PCB by any technique known to one skilled in the art, such as thermosonic bonding or reflow soldering. The die 620 is preferably a surface-mount device (SMD), and can include a surface acoustic wave (SAW) filter, bulk acoustic wave (BAW) filter, power amplifier (PA), or a low-noise amplifier (LNA).

Figure 6A:
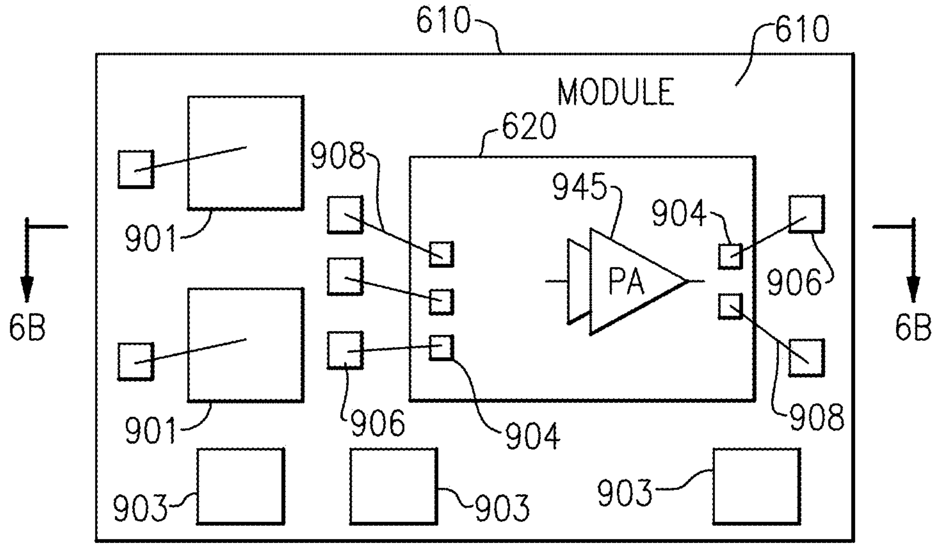
FIG. 6A is a schematic diagram of a top plan-view of an embodiment of a packaged module with a flip-chip die.

The semiconductor die 620 can be arranged within the module on the base PCB layer 610 as shown in FIG. 6A, and the packaged module 600 can include any of a wide variety of type and number of RF components, as is shown and described, for example, with respect to FIGS. 6A through 7B.

With continuing reference to FIG. 4A, a first conformal metal shield layer 625 is applied over the semiconductor die 620 to provide the die with a conductive exterior surface electrically grounded to a common ground of the module 600. The die 620 has a substantially planar top surface over which the conformal shield layer 625 is formed. The first shield layer 625 can wrap around additional surfaces of the die 620 to provide a ground path to the PCB layer 610. In certain embodiments, the first conformal metal shield layer 625 is formed by masking and sputtering metallic paint over the die 620. However, the first shield layer 625 can also be sprayed, printed, or applied to the top surface of the die 620 by any other method known to one skilled in the art. In selected embodiments, the first shield layer 625 is formed from aluminum (Al), copper (Cu), nickel iron (NiFe), tin (Sn), zinc (Zn), or the like. As will be described in greater detail herein, these techniques for constructing a conformal metal shield layer can be applied to the entire packaged module 600 in addition to the individual die(s) 620.

A layer of conductive epoxy 630 is provided above the first shield layer 625 of each semiconductor die 620 to form a ground path from the PCB layer 610 to an exterior of the packaged module 600. The conductive epoxy 630 preferably covers the entirety or a substantial entirety or substantial portion of a conductive upper surface of the die 620, with the epoxy layer extending from the upper surface to the exterior of the packaged module 600, e.g., at an exposed top surface. In certain embodiments, the epoxy layer can have a thickness in a range of approximately 0.1 millimeters to 1 millimeter. In alternate embodiments, the epoxy layer thickness can be less than 0.1 millimeters for improved thermal and electrical conductivity.

The conductive epoxy 630 can be dispensed onto the semiconductor die 620 (such as by a syringe), applied by screen printing, or applied by any other method known to one skilled in the art. In embodiments of the packaged module 600 with multiple dies 620 (such as the module of FIG. 4B), different epoxies or different quantities of epoxy may be applied to each die. In certain embodiments, where there are multiple dies 620 (such as the module of FIG. 4C), the dies 620 may each be of a different thickness, causing the upper surface of each die to be at a different elevation relative to the PCB layer 610. The amount of the epoxy 630 applied to each die 620 can be adjusted to fill in the difference in elevation and create a coplanar exterior surface of the packaged module 600. In the preferred embodiment, the conductive epoxy 630 is a Henkel™ brand conductive silicon adhesive meeting certain criteria of viscosity, adhesion, thermal conductance, and electrical conductance.

Figure 4B:
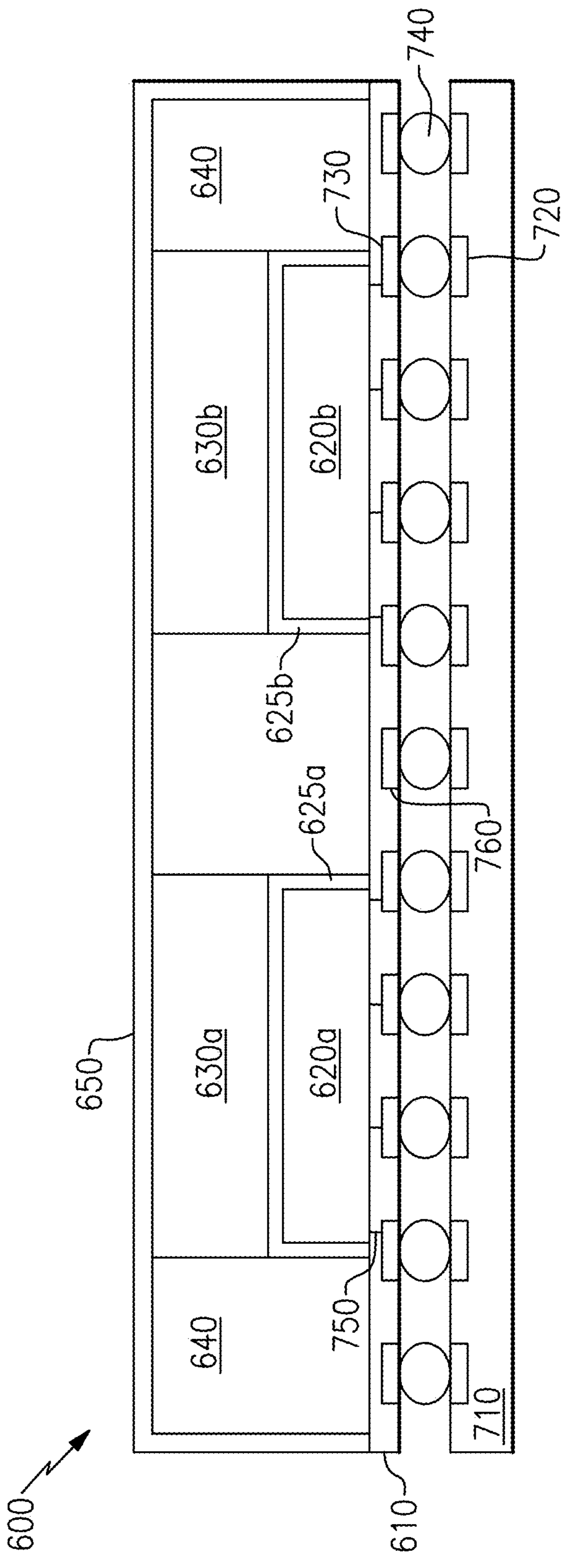
FIG. 4B is a schematic diagram of a cross-section of another embodiment of a packaged module.

As will be discussed herein, the epoxy layer 630 forms a ground path for mitigating EMI signals by grounding an exterior conformal shield 650 on the exterior of the packaged module to a ground of the PCB layer via the electrical connection of the semiconductor die 620 to the PCB layer. In the embodiment of FIG. 4B, the pair of semiconductor dies 620*a/b* and epoxy layers 630*a/b* form a plurality of ground paths between the conformal shield 650 and PCB ground.

Enveloping the semiconductor die(s) 620, a portion of mold compound 640 is applied over the PCB layer 610 to fully cover the PCB layer and protect the semiconductor dies 620. The mold compound 640 can be a contiguous layer that fills the volume of the packaged module, or can be applied in multiple layers of one or more type of mold compound. In the preferred embodiment, the mold compound is a Kyocera™ KE-G1250AH-M20-L epoxy molding compound. In certain embodiments, the mold compound can be made of plastic. As illustrated in FIGS. 5C and 5D, excess mold compound and epoxy is removed to create a smooth exterior surface and expose the epoxy layer 630 on the semiconductor die(s) 620. The mold compound can be removed mechanically, such as by grinding or laser ablation, or by a chemical treatment.

Figure 4C:
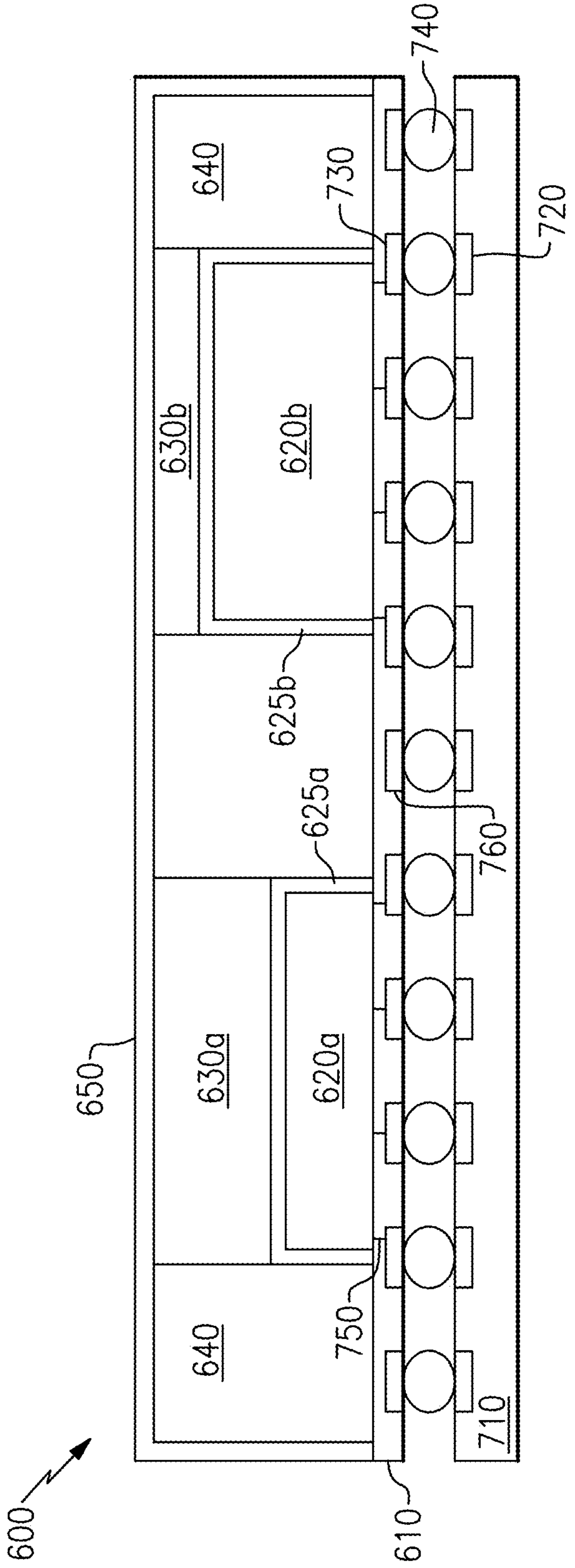
FIG. 4C is a schematic diagram of a cross-section of yet another embodiment of a packaged module.

As shown by FIG. 4C, the thickness of the mold compound layer(s) 630*a/b* can be varied to accommodate semiconductor dies 620*a/b* of different sizes and thicknesses to fully seal the dies within the packaged module 600. As was discussed previously, the quantity of epoxy 630 applied to each of the dies 620*a/b* can be varied to make up the difference in thickness between the dies to create a flush exterior surface of the packaged module 600. In certain embodiments, the mold compound 640 may be molded to the base PCB layer 610 prior to applying epoxy to the die(s), and the conductive epoxy 630 is subsequently used to fill a cavity created above each die 620 by a mold.

With continuing reference to FIGS. 4A through 4C, a conductive metal layer is applied over the smooth exterior surfaces of the packaged module 600, which can include one or more side walls, to form a conformal shield 650 around the packaged module. In one embodiment, the metal layer is formed by sputtering metallic paint over the exterior surfaces of the mold compound 640 to form the conformal shield 650. The metal layer comprising the exterior conformal shield 650 can be formed by any of the same materials or methods used to construct the first conformal shield layer 625 over the die(s).

FIGS. 5A through 5F illustrate the steps of a method for constructing the EMI-shielded packaged modules of FIGS. 4A through 4C.

Figure 5A:
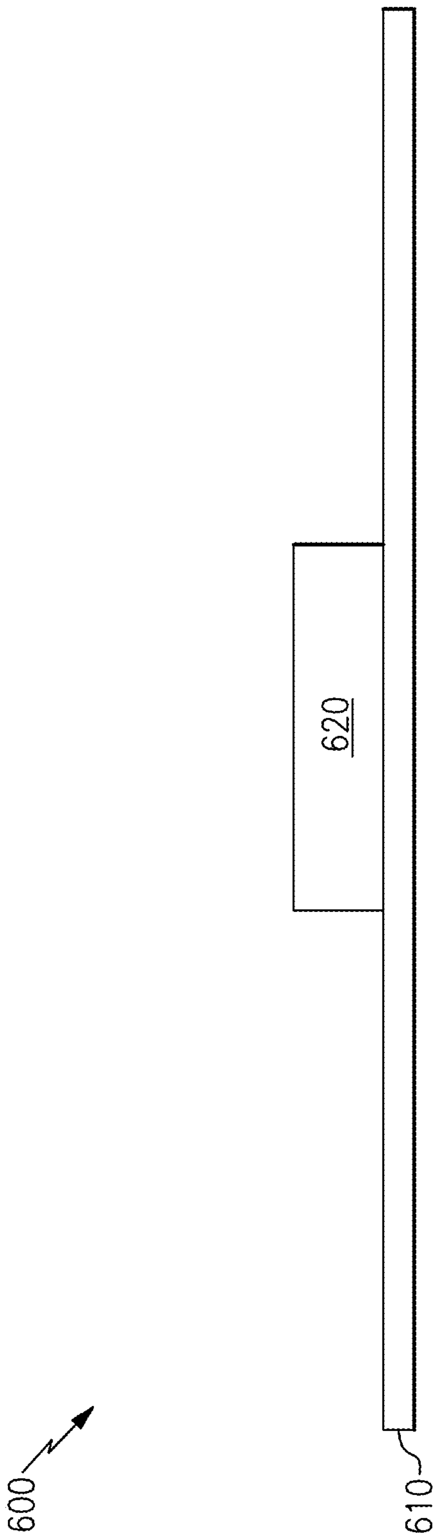
FIGS. 5A-5F illustrate the steps of a method for fabricating a packaged module according to any of the FIGS. 4A-4C.
Figure 5B:
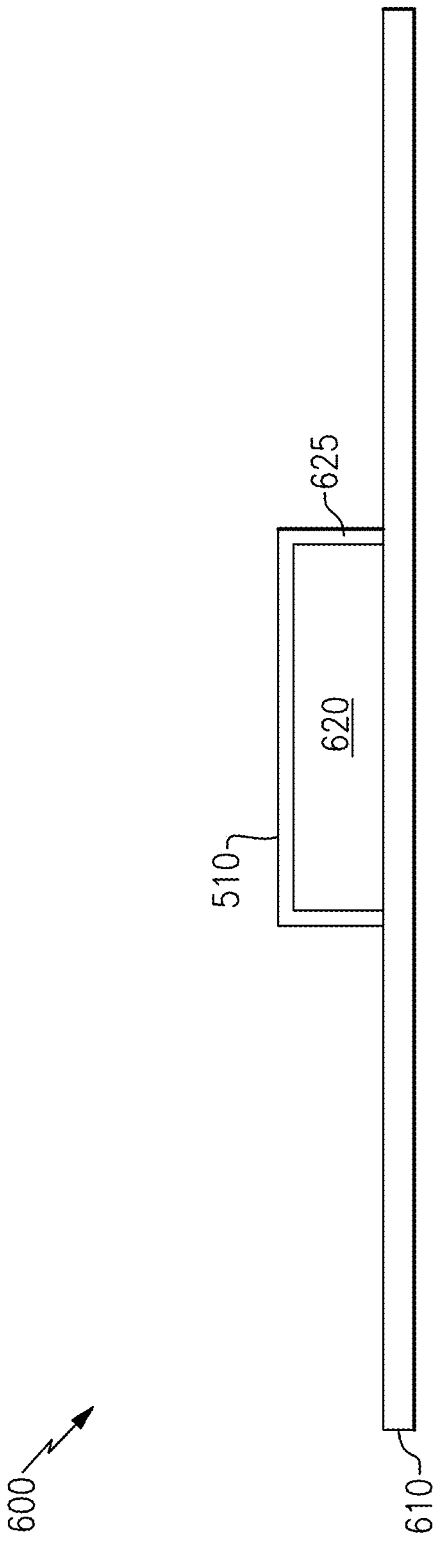
Figure 5C:
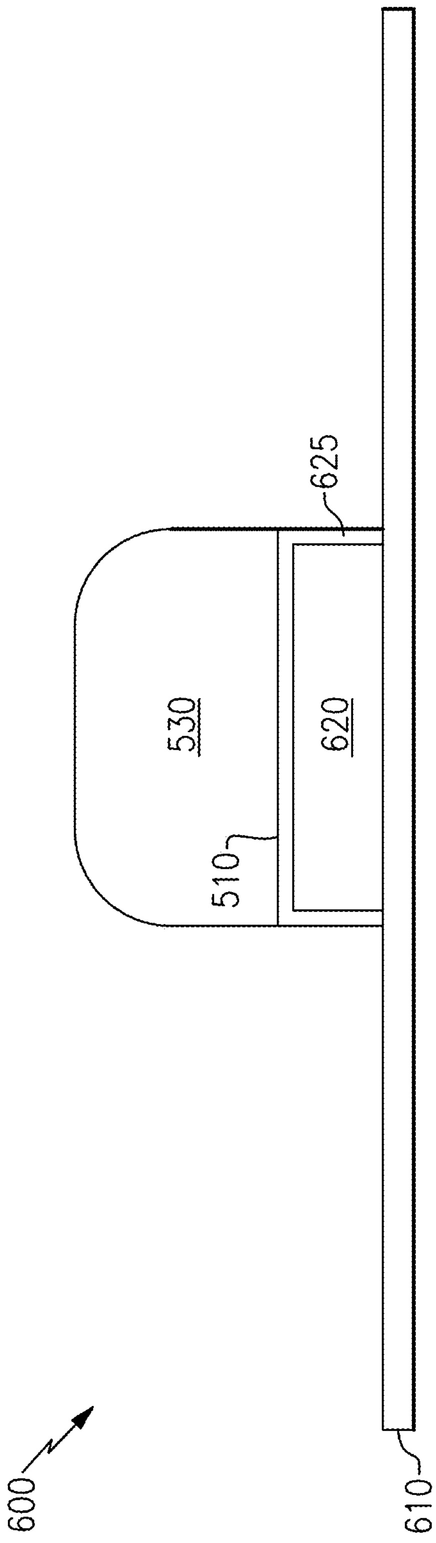
Figure 5D:
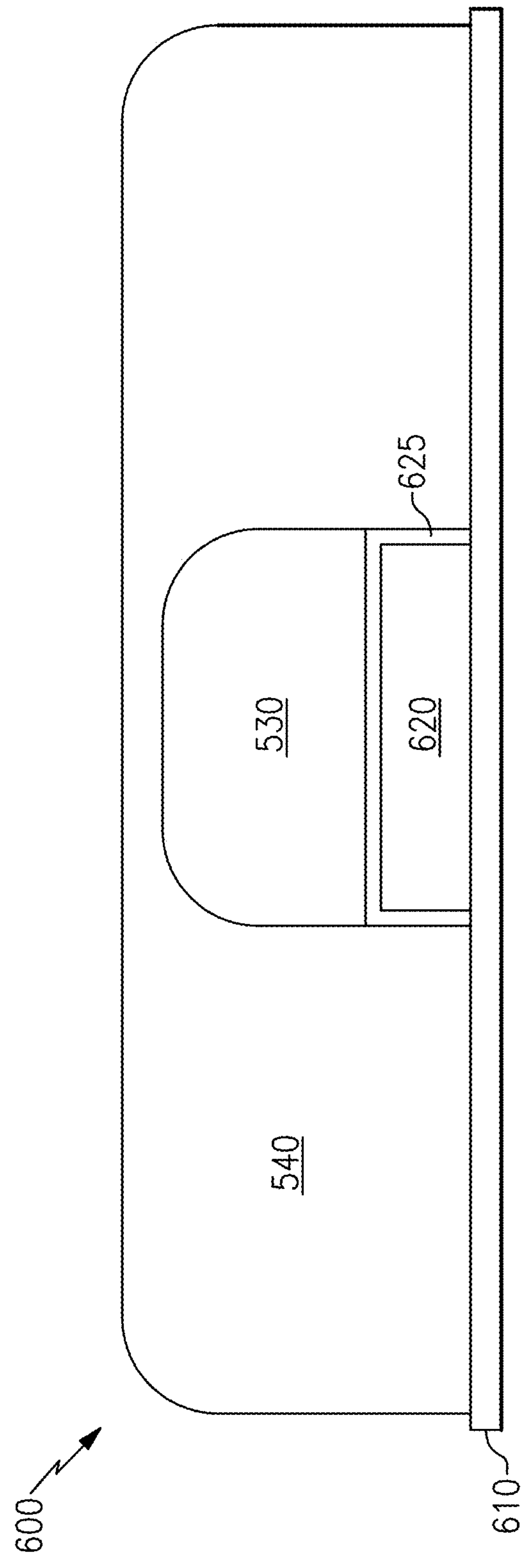

In FIG. 5A, the die 620 is provided on the PCB layer 610 and electrically connected to the PCB layer (such as, by bond wires or soldered die pads). In FIG. 5B, the first conformal metal shield layer 625 is applied (such as by masking and sputtering) over the die 620 to provide the die with a conductive top surface 510 and a ground path to the PCB layer 610. FIG. 5C illustrates forming a portion of conductive epoxy 530 over the conductive top surface 510, whereas FIG. 5D illustrates forming a portion of mold compound 540 over the PCB layer 610. In certain embodiments, the mold compound 540 can be applied before the portion of epoxy 530 by using a mold or mask to prevent the mold compound from blocking the conductive top surface 510 of the die.

Figure 5E:
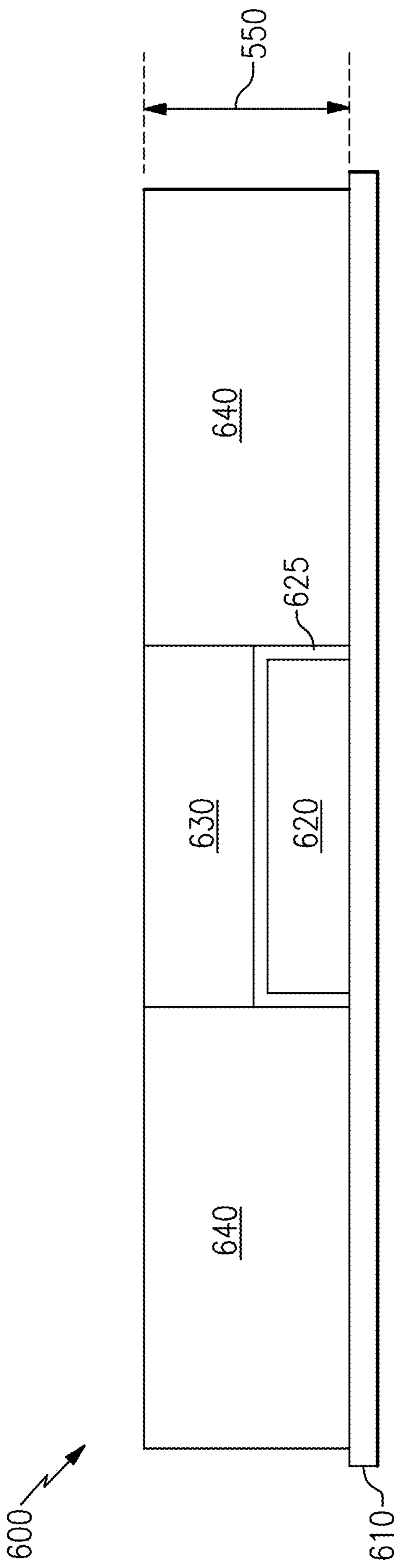

Next, excess mold compound and conductive epoxy is removed to provide the module 600 with a substantially planar exterior surface. As shown in FIG. 5E, this can be performed by grinding away the portions of mold compound 540 and conductive epoxy 530 above a predetermined elevation 550 relative to the PCB layer 610 in order to expose the layer of conductive epoxy 630 over the die 620. The layer of conductive epoxy and the layer of mold compound remaining after grinding or ablation of the module is indicated by 630 and 640, respectively.

Figure 5F:
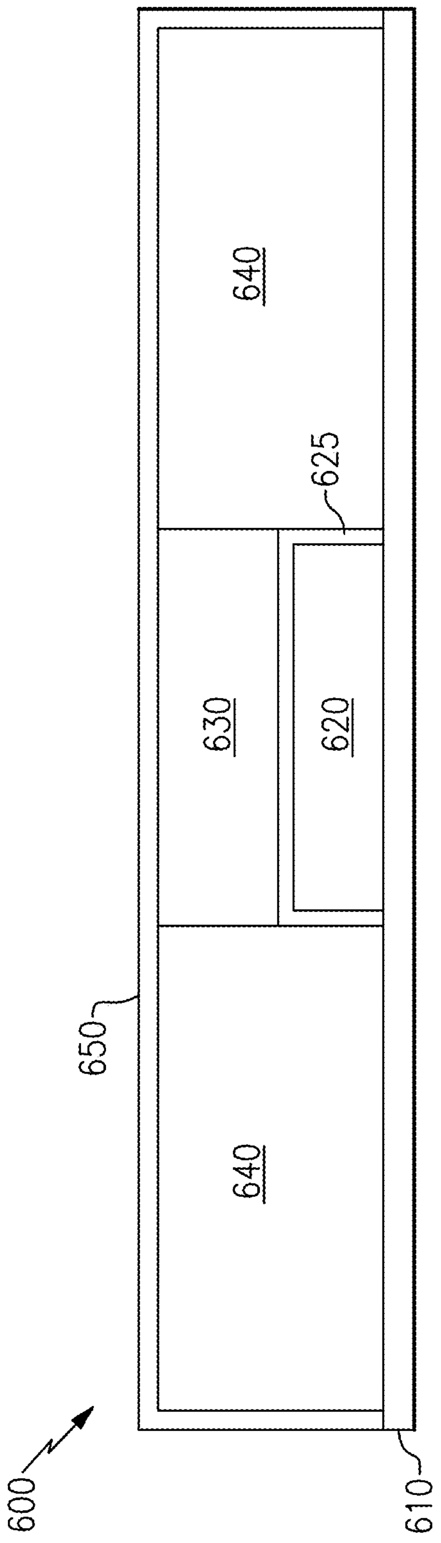

In FIG. 5F, the exterior conformal shield 650 is applied as a layer of metal over the planar exterior surface(s) of the module 600. The exterior conformal shield 650 can be applied by the same methods or formed of the same materials as the first conformal shield layer 625, although the two shield layers are not necessarily identical. (As will be described herein, in certain embodiments, the composition of either shield layer 625/650 can be selected to better mitigate EMI at specific frequencies within the packaged module.) Techniques can include sputtering, spraying, printing, or otherwise applying the metal layer to the top surface of the die 620 by any method known to one skilled in the art. In selected embodiments, the exterior conformal shield 650 is formed from aluminum (Al), copper (Cu), nickel iron (NiFe), tin (Sn), zinc (Zn), or the like.

In certain embodiments, the exterior metal layer is applied only over the planar top surface of the packaged module 600 to provide a ground path for the conformal shield 650. A plurality of bond wires extending from the base PCB layer 610 to exterior conformal shield 650 along a perimeter of the packaged module 600 can form a bond wire cage around the packaged module, advantageously acting an EMI shield for the die(s) 620. The EMI shield can be formed during formation of the packaged module 600 by bonding the ends of bond wires to respective bond pads, which can be formed on the PCB layer 610. The mold compound 640 can then be used in any molding process as known in the art to cover the semiconductor die(s) 620*a*/*b*, the bond pads, and the base PCB layer 610 and to encapsulate the wirebonds that form the bond wire cage.

By utilizing bond wires to form an EMI shield, the shield can more easily accommodate variations in package size and has increased scalability compared to a conventional prefabricated metal shield. Moreover, since wirebonds can be significantly narrower than the walls of the conventional prefabricated metal shield, the invention's EMI shield consumes less space in the packaged module compared to the conventional prefabricated metal shield.

The conformal shield 650 blocks or significantly attenuates RF signals from entering or exiting the packaged module 600. FIG. 4A illustrates how RF emissions 660 of the semiconductor die 620 can be coupled to a circuit ground by a plurality of ground paths 670 formed by the conductive epoxy layer 630 and conformal shield 650. The first conformal metal shield layer 625 provides a first degree of attenuation, and the exterior conformal shield 650 couples attenuated RF emissions 660 to ground. RF emissions external to the packaged module 600 can also be coupled to ground for EMI mitigation. As will be understood by those skilled in the art, the effectiveness of the EMI shielding varies with shield thickness, shield composition, signal strength and frequency, and other factors. Depending on the application (such as in the mobile device of FIG. 2), the materials and dimensions of the conformal shield 650 may be selected specifically to block EMI in certain frequency bands, such as the n77, n78, and n79 NR bands. In one embodiment, the conformal shield 650 may be configured to attenuate RF signals at a target frequency or within a target frequency range by at least 5 dB. In other embodiments, the conformal shield may be configured to provide 10, 15, or 20 (or higher) dB of signal attenuation.

Advantageously, the conformal shield 650 offers EMI shielding of the packaged module 600 without requiring additional surface area on a PCB to mount a traditional EMI shield. Because the conformal shield 650 is integral to the package and grounded to the semiconductor die(s) 620 via the conductive epoxy 630, this form of EMI shielding is highly versatile and can be implemented in many applications without requiring a PCB designer to route additional ground paths.

Referring again to FIGS. 4B and 4C, cross-sectional views of a packaged module 600 with two adjacent semiconductor dies 620*a*/*b* are shown. The semiconductor dies 620*a* and 620*b* can be dies of different types (e.g., an RF front end system and a control processor) or different sizes, such as in the embodiment of FIG. 4C.

As shown, each packaged module 600 comprises an array of ball-shaped contacts 740, which form a ball grid array (BGA). In this manner, the packaged module is a BGA surface-mount device (SMD) package for mounting to a board 710, which can be a PCB-based board configured to accommodate more than one packaged module and other appropriate components. For example, the board 710 can be a mobile phone board, or a board for a tablet, laptop, or other type of portable electronic device. The BGA package provides a convenient and scalable method of connecting the base PCB of the packaged module 600 to a substrate PCB containing additional circuit elements.

On a surface of the board 710, a first plurality of conductive pads 720 are provided, some or all of which can be connected to various traces within a PCB substrate of the board 710. On an obverse side of the base PCB 610 from the dies 620*a*/*b*, a second plurality of conductive pads 730 are provided, each of the second plurality of pads 730 corresponding to one of the pads of the first plurality 720 on the board 710. The pads of the first and second pluralities 720/730 can be arranged substantially in a grid pattern.

Within the PCB layer 610, a plurality of bond wires 750 electrically connect each pad of the second plurality 730 to one of the semiconductor dies 620*a*/*b*. Each of the pads may have a bond wire connection to no more than one semiconductor die 620*a*/*b*, but each of the dies 620*a*/*b* can have hundreds or thousands of connections to the various pads 730. In some embodiments, certain pads 760 of the first and second pluralities 720/730 remain electrically disconnected from bond wires or PCB traces, particularly when the die(s) of a specific packaged module 600 do not require as many electrical connections as are provided by the plurality of pads, or if routing bond wires 750 within a certain region of the PCB layer 610 is not practical. Each electrically disconnected pad 760 can still be connected to a corresponding pad via a contact 740 to provide a more secure mechanical connection between the packaged module 600 and the board 710. As will be described herein, soldering of the first and second pluralities of pads 720 can be performed in a single manufacturing step, and does not require additional resources to facilitate a connection between the electrically disconnected pads 760.

The base PCB 610 and the board 710 are coupled electrically and mechanically by the plurality of solder balls 740 applied between the first and second plurality of pads 720/730. Solder is first applied to either of the plurality of pads 720/730, such as by running molten solder over the pads, and then cooled to solidify into the solder balls 740. The BGA package 700 is brought into close proximity with the substrate PCB layer 710, and the first and second pluralities of pads 720/730 are aligned and the solder balls 740 re-flowed to adhere the solder between the pads on either side. In certain embodiments, the solder may be applied only once the BGA package 700 and substrate PCB layer 710 are already aligned. Those skilled in the art will envision various other methods and applications related to the BGA package 700 disclosed herein.

In the various examples herein, a conformal shield 650 and its contact with an exposed metal surface of an SMD (e.g., 620*a*/*b*) via conductive epoxy 630 are described in the context of formation of an electrical conduction path to facilitate the grounding path between the conformal shield metal layer and a ground plane of the packaging substrate. However, it will be understood that one or more features associated with such a conformal shield 650 in electrical contact with an upper surface of the SMD can also be utilized to provide other conduction paths between the SMD and the conformal shield 650. For example, heat can be transferred from the SMD through its upper surface and to the shield through conduction. In such an application, the conformal shield 650, conductive epoxy 630, and the upper surface of the SMD 620 can be configured to provide good thermal conduction properties, and may or may not include electrical conduction properties.

For the purpose of description herein, a surface mount device (SMD) can include any device mountable on a substrate such as a packaging substrate utilizing various surface mount technologies. In some embodiments, an SMD can include any device mountable on a packaging substrate and having an upper surface. In some embodiments, such an upper surface can be larger than an upper portion of a curved bond wire. An SMD can include active and/or passive components; and such components can be configured for RF and/or other applications. Such an SMD is also referred to herein as, for example, an RF component, a component, a filter, a CSSD, a shielding-component, a functional component, and the like. It will be understood that such terms can be used interchangeably in their respective contexts.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Additional Embodiments of a Packaged Module

Figure 6B:
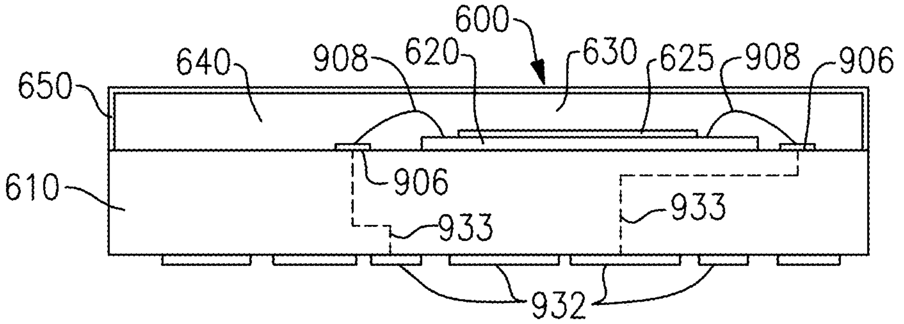
FIG. 6B is a schematic diagram of a cross-section of the packaged module of FIG. 6A taken along the lines 6B-6B.

FIG. 6A is a schematic diagram of one embodiment of a packaged module 600. FIG. 6B is a schematic diagram of a cross-section of the packaged module 600 of FIG. 6A taken along the lines 6B-6B.

The packaged module 600 includes radio frequency components 901, a semiconductor die 620, surface mount devices 903, an epoxy layer 630, wirebonds 908, a package substrate 610, an encapsulation structure (such as the layer of mold compound 640), a first conformal shield layer 625, and an exterior conformal shield 650. The package substrate 610 includes pads 906 formed from conductors disposed therein. Additionally, the semiconductor die 902 includes pins or pads 904, and the wirebonds 908 have been used to connect the pads 904 of the die 620 to the pads 906 of the package substrate 610.

The semiconductor die 620 includes a power amplifier 945, which can be implemented in accordance with one or more features disclosed herein.

The package substrate 610 can be configured to receive a plurality of components such as radio frequency components 901, the semiconductor die 620, and the surface mount devices 903, which can include, for example, surface mount capacitors and/or inductors. In one implementation, the radio frequency components 901 include integrated passive devices (IPDs).

As shown in FIG. 6B, the packaged module 600 can include a plurality of contact pads 932 disposed on a side of the packaged module 600 opposite the side used to mount the semiconductor die 620. Configuring the packaged module 600 in this manner can aid in connecting the packaged module 600 to a circuit board, such as a phone board of a mobile device. The example contact pads 932 can be configured to provide radio frequency signals, bias signals, and/or power (for example, a power supply voltage and ground) to the semiconductor die 620 and/or other components. As shown in FIG. 6B, the electrical connections between the contact pads 932 and the semiconductor die 620 can be facilitated by connections 933 through the package substrate 610. The connections 933 can represent electrical paths formed through the package substrate 610, such as connections associated with vias and conductors of a multilayer laminated package substrate. In some embodiments, other types of contact pads can be used. For example, an array of balls can be arranged to form a ball-grid array such as those of FIGS. 4B, 4C, and 7A.

In some embodiments, the packaged module 600 can also include one or more packaging structures to, for example, provide protection and/or facilitate handling. Such a packaging structure can include overmold or encapsulation structure 640 formed over the package substrate 610 and the components and die(s) disposed thereon.

It will be understood that although the packaged module 600 is described in the context of electrical connections based on wirebonds, one or more features of the present disclosure can also be implemented in other packaging configurations, including, for example, flip chip configurations.

Figure 7A:
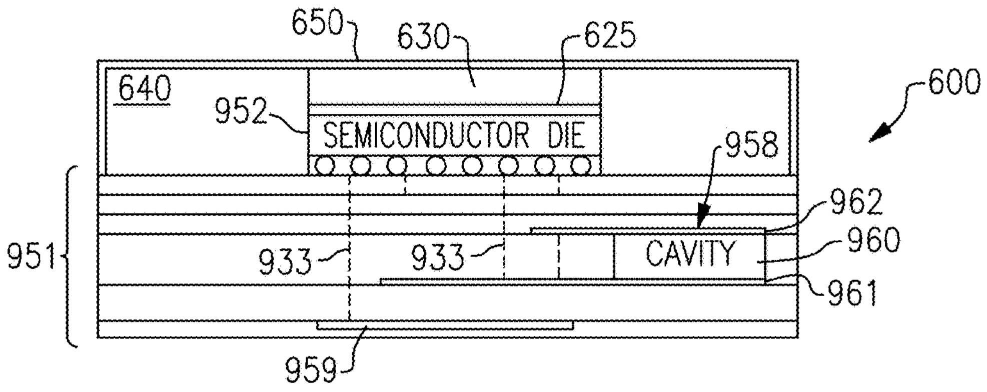
FIG. 7A is a schematic diagram of a cross-section of an embodiment of a packaged module with cavity-based antennas.

FIG. 7A is a schematic diagram of a cross-section of another embodiment of a packaged module 600. The packaged module 600 includes a laminated package substrate 951, a flip-chip die 952, a first conformal shield layer 625, a conductive epoxy layer 630, a layer of mold compound 640 acting as an encapsulation structure, and an exterior conformal shield 650.

The laminated package substrate 951 includes a cavity-based antenna 958 associated with an air cavity 960, a first conductor 961, a second conductor 962. The laminated package substrate 951 further includes a planar antenna 959.

In certain implementations herein, a packaged module includes one or more integrated antennas. For example, the packaged module 600 of FIG. 7A includes the cavity-based antenna 958 and the planar antenna 959. By including antennas facing in multiple directions (including, but not limited to, directions that are substantially perpendicular to one another), a range of available angles for communications can be increased. Although one example of a packaged module with integrated antennas is shown, the teachings herein are applicable to modules implemented in a wide variety of ways.

Figure 7B:
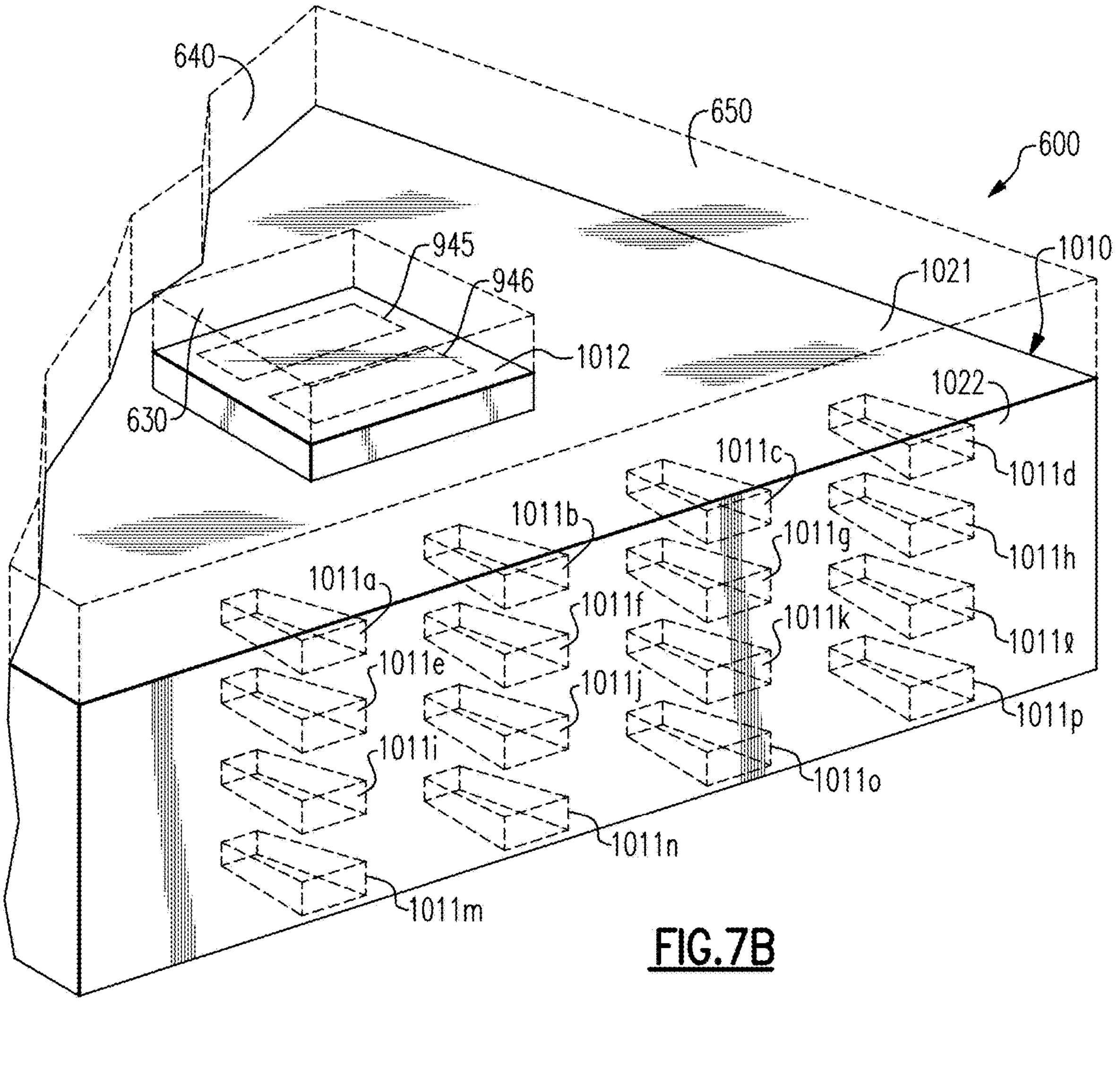
FIG. 7B is a perspective view of the packaged module of FIG. 7A.

FIG. 7B is a perspective view of another embodiment of a packaged module 600. The module 600 includes a laminated substrate 1010 and a semiconductor die 1012 encapsulated underneath a layer of conductive epoxy 630 and a layer of mold compound 640. In certain embodiments, the semiconductor die 1012 can be of the same type as the flip-chip die 952 of FIG. 7A. The semiconductor die 1012 includes at least one of a front end system 945 or a transceiver 946. (For ease of illustration, a first conformal shield layer 625 is not shown above the die 1012 in FIG. 7B) For example, the front end system 945 can include signal conditioning circuits, such as controllable amplifiers and/or controllable phase shifters, to aid in providing beamforming.

In the illustrated embodiment, cavity-based antennas 1011*a*-1011*p* have been formed on an edge 1022 of the laminated substrate 1010. In this example, sixteen cavity-based antennas have been provided in a four-by-four (4×4) array. However, more or fewer antennas can be included and/or antennas can be arrayed in other patterns.

In another embodiment, the laminated substrate 1010 further include another antenna array (for example, a patch antenna array) formed on a second major surface of the laminated substrate 1010 opposite the first major surface 1021. Implementing the module 600 aids in increasing a range of angles over which the module 600 can communicate.

The module 600 illustrates another embodiment of a module including an array of antennas that are controllable to provide beamforming. Implementing an array of antennas on a side of module aids in communicating at certain angles and/or directions that may otherwise be unavailable due to environmental blockage. Although an example with cavity-based antennas is shown, the teachings herein are applicable to implementations using other types of antennas.

Applications

Devices employing the above-described schemes can be implemented into various electronic devices and multimedia communication systems. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), and/or all of the steps of any method or process so disclosed, can be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only, and are not intended to limit the scope of protection. Indeed, the novel methods and systems described herein may be embodied in a variety of other forms. Furthermore, various omissions, substitutions, and changes in the form of the methods and systems described herein may be made. Those skilled in the art will appreciate that in some embodiments, the actual steps taken in the processes illustrated and/or disclosed may differ from those shown in the figures. Depending on the embodiment, certain of the steps described above may be removed, others may be added. For example, the actual steps and/or order of steps taken in the disclosed processes may differ from those shown in the figure. Depending on the embodiment, certain of the steps described above may be removed, others may be added. Furthermore, the features and attributes of the specific embodiments disclosed above may be combined in different ways to form additional embodiments, all of which fall within the scope of the present disclosure.

Conditional language used herein, such as, among others, "can," "could", "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied. Additionally, the words "herein," "above," "below," and words of similar import, when used in this application, refer to this application as a whole and not to any particular portions of this application.

Conjunctive language, such as the phrase "at least one of X, Y and Z," unless specifically stated otherwise, is to be understood with the context as used in general to convey that an item, term, etc. may be either X, Y, or Z, or a combination thereof. Thus, such conjunctive language is not generally intended to imply that certain embodiments require at least one of X, at least one of Y and at least one of Z to each be present.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

Although the present disclosure includes certain embodiments, examples and applications, it will be understood by those skilled in the art that the present disclosure extends beyond the specifically disclosed embodiments to other alternative embodiments and/or uses and obvious modifications and equivalents thereof, including embodiments which do not provide all of the features and advantages set forth herein. Accordingly, the scope of the present disclosure is not intended to be limited by the specific disclosures of preferred embodiments herein, and may be defined by claims as presented herein or as presented in the future.

What is claimed is:

1. A method of constructing a shielded integrated circuit package, comprising:
- mounting a semiconductor die to a printed circuit board;
- applying a conductive adhesive layer over a conductive top surface of the semiconductor die;
- applying an over-mold above the printed circuit board, encasing a periphery of the semiconductor die within the over-mold;
- removing an excess portion of the over-mold to expose at least a portion of the conductive adhesive layer; and
- applying a conformal metal shield over the over-mold, the conductive adhesive layer and the conformal metal shield forming a path from the semiconductor die to a ground reference.

2. The method of claim 1 wherein the semiconductor die includes one or more of a surface acoustic wave filter, bulk acoustic wave filter, power amplifier, or low-noise amplifier.

3. The method of claim 1 wherein the conformal metal shield includes aluminum, copper, nickel, iron, tin, or zinc.

4. The method of claim 1 wherein the conformal metal shield is configured to attenuate radio frequency signals in the n77, n78, or n79 New Radio frequency bands.

5. The method of claim 4 wherein the conformal metal shield is configured to attenuate radio frequency signals in one or more of the New Radio frequency bands by at least 5 dB.

6. The method of claim 1 wherein mounting the semiconductor die to the printed circuit board includes forming an electrical and mechanical connection between a first plurality of contact pads and a corresponding second plurality of contact pads.

7. The method of claim 6 wherein a subset of the first plurality of contact pads and a corresponding subset of the corresponding second plurality of contact pads are provided to form a mechanical connection between the semiconductor die and the printed circuit board.

8. The method of claim 1 wherein the semiconductor die is mounted to the printed circuit board using surface-mount technology.

9. The method of claim 1 wherein applying the conformal metal shield is performed by sputtering or spraying a metallic paint.

10. The method of claim 1 wherein applying the conformal metal shield is performed by shaping a portion of solid metal over the over-mold.

11. The method of claim 10, wherein applying the conformal metal shield further includes forming a plurality of bond wires about a perimeter of the shield integrated circuit package.

12. The method of claim 1, wherein applying the conductive adhesive layer is performed by dispensing or screen printing.

13. The method of claim 1, wherein removing the excess portion of the over-mold is performed by cutting or grinding.

14. The method of claim 1, wherein removing the excess portion of the over-mold is performed by laser ablation.

15. The method of claim 1, wherein removing the excess portion of the over-mold is performed by a chemical treatment.

16. A method of constructing a radio frequency packaged module, the method comprising:
- mounting a first and a second semiconductor die to a printed circuit board, each of the semiconductor dies having a conductive top surface;
- applying a first conductive adhesive layer over a corresponding conductive top surface of the first semiconductor die;
- applying a second conductive adhesive layer over a corresponding conductive top surface of the second semiconductor die;
- applying an over-mold above the printed circuit board, encasing a periphery of each of the first and second semiconductor dies while exposing at least a portion of each of the first and second conductive adhesive layers; and
- applying a conformal metal shield over the over-mold and over the conductive adhesive layers such that the first conductive adhesive layer and the conformal metal shield form a path from the first semiconductor die to a ground reference, and the second conductive adhesive layer and the conformal metal shield form a path from the second semiconductor die to the ground reference.

17. The method of claim 16 wherein at least one of the semiconductor dies include a surface acoustic wave filter, bulk acoustic wave filter, power amplifier, or a low-noise amplifier.

18. The method of claim 16 wherein the radio frequency packaged module is a front-end module.

19. The method of claim 16 wherein the conformal metal shield is configured to attenuate radio frequency signals causing electromagnetic interference in the n77, n78, or n79 New Radio frequency bands.

20. The method of claim 19 wherein the conformal metal shield is configured to attenuate radio frequency signals in one or more of the New Radio frequency bands by at least 5 dB.

* * * * *